United States Patent
Tsai et al.

(10) Patent No.: US 10,790,444 B2
(45) Date of Patent: *Sep. 29, 2020

(54) METHOD FOR FORMING A PHASE CHANGE MEMORY (PCM) CELL WITH A LOW DEVIATION CONTACT AREA BETWEEN A HEATER AND A PHASE CHANGE ELEMENT

(71) Applicant: Taiwan Semiconductor Manufacturing Co., Ltd., Hsin-Chu (TW)

(72) Inventors: Yi Jen Tsai, New Taipei (TW); Shih-Chang Liu, Alian Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/587,447

(22) Filed: Sep. 30, 2019

(65) Prior Publication Data
US 2020/0028075 A1    Jan. 23, 2020

Related U.S. Application Data

(63) Continuation of application No. 16/007,116, filed on Jun. 13, 2018, now Pat. No. 10,490,742.
(Continued)

(51) Int. Cl.
*H01L 45/00* (2006.01)
*H01L 27/24* (2006.01)

(52) U.S. Cl.
CPC ...... *H01L 45/1233* (2013.01); *H01L 27/2436* (2013.01); *H01L 27/2463* (2013.01);
(Continued)

(58) Field of Classification Search
CPC .................................................. H01L 45/1233
See application file for complete search history.

(56) References Cited

U.S. PATENT DOCUMENTS 7,687,796 B2 *  3/2010  Harshfield ........ H01L 21/76877
257/5
7,858,960 B2   12/2010  Chang
(Continued)

OTHER PUBLICATIONS

Non-Final Office Action dated Mar. 20, 2019 for U.S. Appl. No. 16/007,116.
(Continued)

*Primary Examiner* — William Coleman
(74) *Attorney, Agent, or Firm* — Eschweiler & Potashnik, LLC

(57) ABSTRACT

A phase change memory (PCM) cell with a low deviation contact area between a heater and a phase change element is provided. The PCM cell comprises a bottom electrode, a dielectric layer, a heater, a phase change element, and a top electrode. The dielectric layer overlies the bottom electrode. The heater extends upward from the bottom electrode, through the dielectric layer. Further, the heater has a top surface that is substantially planar and that is spaced below a top surface of the dielectric layer. The phase change element overlies the dielectric layer and protrudes into the dielectric layer to contact with the top surface of the heater. Also provided is a method for manufacturing the PCM cell.

20 Claims, 9 Drawing Sheets

Related U.S. Application Data

(60) Provisional application No. 62/550,770, filed on Aug. 28, 2017.

(52) U.S. Cl.
CPC ............ *H01L 45/06* (2013.01); *H01L 45/126* (2013.01); *H01L 45/144* (2013.01); *H01L 45/1683* (2013.01)

(56) References Cited

U.S. PATENT DOCUMENTS

| | | |
|---|---|---|
| 8,105,859 B2 | 1/2012 | Breitwisch et al. |
| 8,324,605 B2 | 12/2012 | Lung et al. |
| 8,426,967 B2 | 4/2013 | Joseph et al. |
| 8,530,875 B1 | 9/2013 | Chang et al. |
| 9,111,856 B2 | 8/2015 | Pellizzer et al. |
| 9,183,928 B2 | 11/2015 | Bedeschi |
| 9,257,643 B2 | 2/2016 | Cheng et al. |
| 9,412,602 B2 * | 8/2016 | Blomberg ......... H01L 21/28562 |
| 2008/0277642 A1 | 11/2008 | In T Zandt et al. |
| 2009/0218557 A1 | 9/2009 | Sato |
| 2011/0089394 A1 | 4/2011 | Kakegawa |
| 2014/0301137 A1 | 10/2014 | Kim et al. |
| 2016/0072059 A1 | 3/2016 | Kim et al. |

OTHER PUBLICATIONS

Notice of Allowance dated Jul. 24, 2019 for U.S. Appl. No. 16/007,116.

* cited by examiner

METHOD FOR FORMING A PHASE CHANGE MEMORY (PCM) CELL WITH A LOW DEVIATION CONTACT AREA BETWEEN A HEATER AND A PHASE CHANGE ELEMENT

REFERENCE TO RELATED APPLICATIONS

This Application is a Continuation of U.S. application Ser. No. 16/007,116, filed on Jun. 13, 2018, which claims the benefit of U.S. Provisional Application No. 62/550,770, filed on Aug. 28, 2017. The contents of the above-referenced Patent Applications are hereby incorporated by reference in their entirety.

BACKGROUND

Flash memory is a widely used type of nonvolatile memory. However, flash memory is expected to encounter scaling difficulties. Therefore, alternatives types of nonvolatile memory are being explored. Among these alternatives types of nonvolatile memory is phase change memory (PCM). PCM is a type of nonvolatile memory in which a phase of a phase change element is employed to represent a unit of data. PCM has fast read and write times, non-destructive reads, and high scalability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
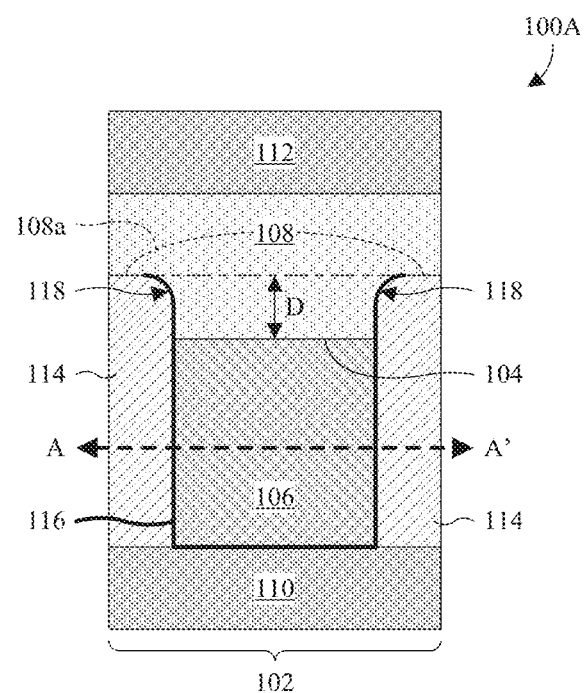
FIGS. 1A and 1B illustrate various views of some embodiments of a phase change memory (PCM) structure comprising a PCM cell with a low deviation contact area between a heater and a phase change element (PCE).

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A phase change memory (PCM) cell includes a bottom electrode and a top electrode, as well as a dielectric layer, a resistive heater, and a phase change element (PCE). The dielectric layer and the PCE are stacked between the bottom and top electrodes, and the PCE is between the dielectric layer and the top electrode. Further, the resistive heater extends from the PCE, through the dielectric layer, to the bottom electrode.

During a method for manufacturing the PCM cell in bulk, a plurality of heater openings is formed in the dielectric layer, and a heater layer is formed covering the dielectric layer and filling the heater openings. A planarization is performed into the heater layer and the dielectric layer to form a plurality of heaters respectively in the heater openings. A phase change layer is formed covering and contacting the heaters, and the phase change layer is patterned into a plurality of PCEs respectively overlying and contacting the heaters.

A challenge with manufacturing the PCM cell in bulk is that the planarization forms the heaters with top surfaces that have high deviation (i.e., are non-uniform), such that heater-to-PCE contact areas also have high deviation. The high deviation in the heater-to-PCE contact areas, in turn, leads to high deviation in reset currents and high deviation in set currents. The set and reset currents are currents applied across the heaters to change active regions of corresponding PCEs between crystalline and amorphous phases.

Various embodiments of the present application are directed towards a method for manufacturing a PCM cell with a low deviation contact area between a heater and a PCE. In some embodiments, a heater dielectric layer is formed overlying a bottom electrode. A heater opening is formed in the heater dielectric layer. The heater opening exposes the bottom electrode. The heater is formed in the heater opening. The heater has a top surface that is curved, and that is at least partially above a top surface of the heater dielectric layer. An etch back is performed into the heater to flatten the top surface of the heater, and to recess the top surface of the heater to below the top surface of the heater dielectric layer. The PCE is formed overlying and contacting the top surface of the heater.

By flattening the top surface of the heater, and by recessing the top surface of the heater to below the top surface of the heater dielectric layer, the contact area between the heater and the PCE is substantially defined by dimensions of the heater opening. Since the heater opening may be formed in bulk with low deviation in dimensions, the contact area may have low deviation during bulk manufacture of the PCM cell. This allows the PCM cell to be manufactured in bulk with set and reset currents that have low deviation, which leads to a large process window and high yields.

Figure 1B:
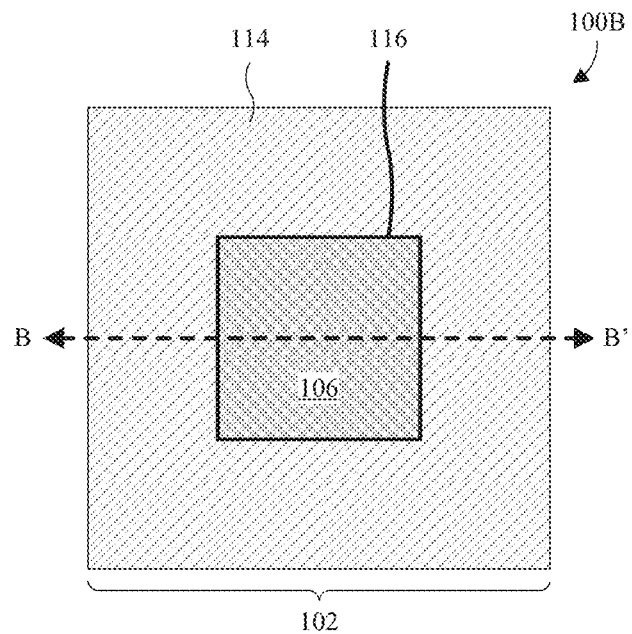

With reference to FIGS. 1A and 1B, various views 100A, 100B of some embodiments of a PCM structure comprising a PCM cell 102 with a low deviation contact area 104 between a heater 106 and a PCE 108 are provided. FIG. 1A may, for example, be taken along line B-B' in FIG. 1B. FIG. 1B may, for example, be taken along line A-A' in FIG. 1A.

As illustrated by the cross-sectional view 100A of FIG. 1A, the PCM cell 102 comprises the heater 106 and the PCE 108, as well as a bottom electrode 110, a top electrode 112, and a heater dielectric layer 114. The bottom and top electrodes 110, 112 are conductive, and may be or otherwise include, for example, tungsten, copper, aluminum copper, or a combination of the foregoing. Further, the bottom and top electrodes 110, 112 may be, for example, vias and/or metal wires.

The heater dielectric layer 114 overlies the bottom electrode 110, between the top and bottom electrodes 110, 112. Further, the heater dielectric layer 114 comprises a heater opening 116 extending through the heater dielectric layer 114, from a top surface of the heater dielectric layer 114 to the bottom electrode 110. In some embodiments, top corners 118 of the heater dielectric layer 114 that are in the heater opening 116 are rounded or otherwise curved. The heater dielectric layer 114 may be or otherwise include, for example, silicon dioxide, silicon nitride, some other dielectric, or a combination of the foregoing.

The heater 106 partially fills the heater opening 116, along the bottom of the heater opening 116, and has a top surface recessed below a top surface of the heater dielectric layer 114 by a distance D. The top surface of the heater 106 may be, for example, substantially flat or planar. Further, the heater 106 is electrically coupled to the bottom electrode 110 and, in some embodiments, contacts the bottom electrode 110. The heater 106 is configured to generate heat in proportion to a current applied across the heater 106. The heater 106 may, for example, generate heat resistively, and/or may be, for example, titanium nitride, tungsten nitride, titanium carbide, some other high resistance material, or a combination of the foregoing. Further, the heater 106 may, for example, have a square or rectangular profile.

The PCE 108 overlies the heater dielectric layer 114, between the heater dielectric layer 114 and the top electrode 112. Further, the PCE 108 partially fills the heater opening 116 and contacts the top surface of the heater 106 at the low deviation contact area 104. The low deviation contact area 104 has low deviation during bulk manufacture of the PCM cell 102 since the low deviation contact area 104 is substantially defined by dimensions of the heater opening 116, and the dimensions of the heater opening 116 have low deviation during bulk manufacture of the PCM cell 102. The PCE 108 includes an active PCE region 108a extending upward into the PCE 108 from the low deviation contact area 104.

The active PCE region 108a has a variable phase representing a data bit. For example, a crystalline phase of the active PCE region 108a and an amorphous phase of the active PCE region 108a may respectively represent a binary "1" and a binary "0", or vice versa. Further, the active PCE region 108a has a variable resistance that changes with the variable phase of the active PCE region 108a. For example, the active PCE region 108a may have a high resistance in the amorphous phase and a low resistance in the crystalline phase. In some embodiments, a bulk of the PCM cell 102 adjoins the active PCE region 108a and has a fixed phase, such as, for example, an amorphous phase or a crystalline phase. The PCE 108, and hence the active PCE region 108a, may be or otherwise include, for example, $Ge_2Sb_2Te_5$ (GST), Ge—In—Sb—Te (GIST), Ag—In—Sb—Te (AIST), or some other chalcogenide compound.

In operation of the PCM cell 102, the data state of the PCM cell 102 is read by measuring the resistance of the PCM cell 102 (i.e., the resistance from the bottom electrode 110 to the top electrode 112). The phase of the active PCE region 108a represents the data state of the PCM cell 102, and the resistance of the active PCE region 108a, and hence the resistance of the PCM cell 102, changes with the phase of the active PCE region 108a. Further, the data state of the PCM cell 102 is set and reset by variably heating the active PCE region 108a to change the phase of the active PCE region 108a.

To change the active PCE region 108a to the crystalline phase (e.g., to set the PCM cell 102), the heater 106 heats the PCE 108 to a first temperature that induces crystallization of the active PCE region 108a. To change the active PCE region 108a to the amorphous phase (e.g., to reset the PCM cell 102), the heater 106 heats the active PCE region 108a to a second temperature that melts the active PCE region 108a. The first temperature is less than the second temperature, and may, for example, be between about 100-150 degrees Celsius. The second temperature may, for example, be greater than about 600, 800, or 1000 degrees Celsius, such as between about 600-800 degrees Celsius.

The amount of heat generated by the heater 106 varies in proportion to the current applied to the heater 106. Further, when the PCM cell 102 is manufactured in bulk, the current to generate a given amount of heat varies with deviation in the low deviation contact area 104. Therefore, the low deviation of the low deviation contact area 104 leads to low deviation in set currents and low deviation in reset currents when the PCM cell 102 is manufactured in bulk. Further, the low deviation of the low deviation contact area 104 leads to a large process window and a high yield during bulk manufacture of the PCM cell 102.

As illustrated by the top view 100B of FIG. 1B, the heater 106 and the heater opening 116 may, for example, have a square layout, a rectangular layout, a triangular layout, or a circular layout. Further, in some embodiments, the low deviation contact area 104 of FIG. 1A has the same layout as the heater 106 in FIG. 1B.

Figure 2A:
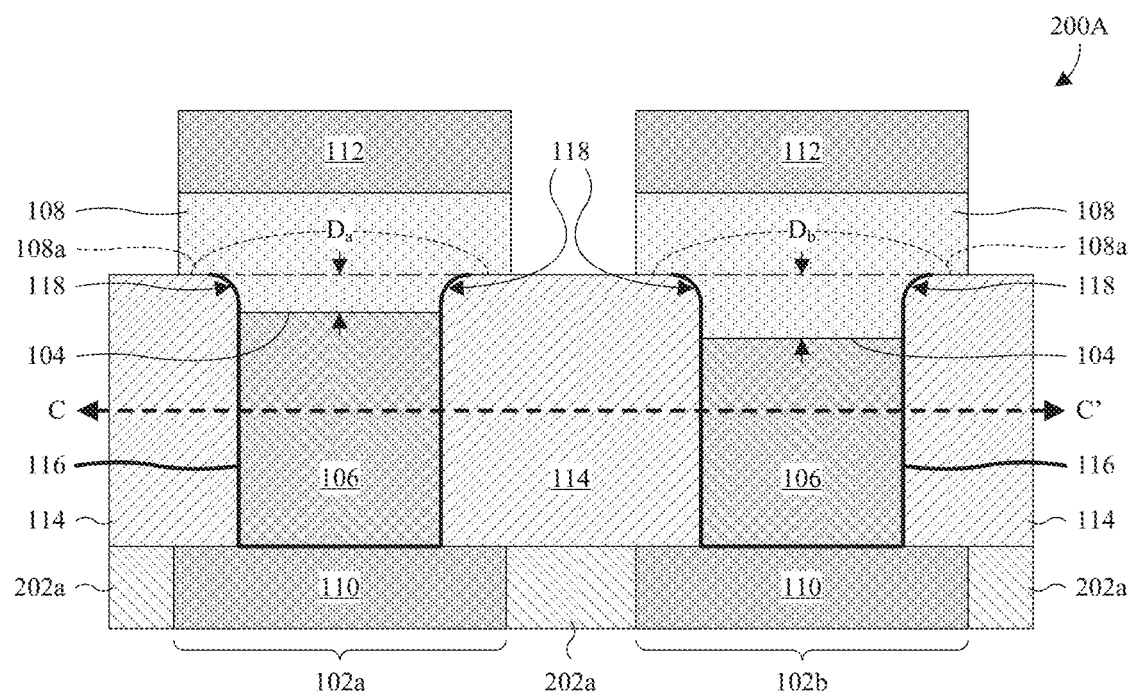
FIGS. 2A and 2B illustrate various views of some embodiments of a PCM structure comprising a pair of PCM cells with heater-to-PCE contact areas that have low deviation.
Figure 2B:
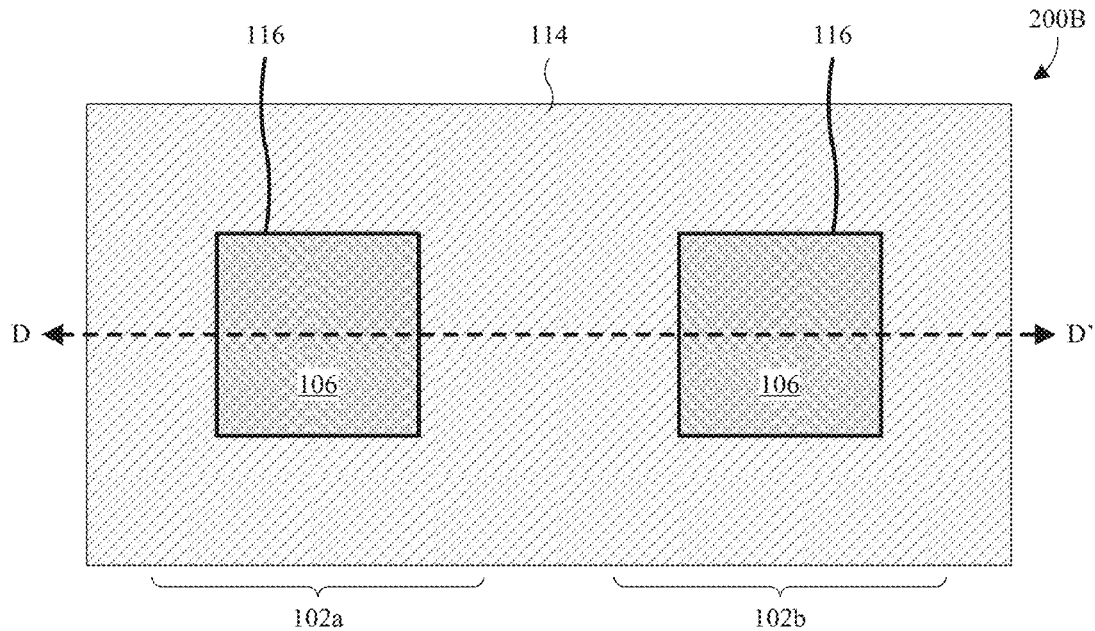

With reference to FIGS. 2A and 2B, various views 200A, 200B of some embodiments of a PCM structure comprising a pair of PCM cells with heater-to-PCE contact areas that have low deviation is provided. FIG. 2A may, for example, be taken along line D-D' in FIG. 2B. FIG. 2B may, for example, be taken along line C-C' in FIG. 2A, and As illustrated by the cross-sectional view 200A of FIG. 2A, the pair of PCM cells comprises a first PCM cell 102a and a second PCM cell 102b. The first and second PCM cells 102a, 102b are each as the PCM cell 102 of FIGS. 1A and 1B is described. The first and second PCM cells 102a, 102b share a heater dielectric layer 114, and each comprises a bottom electrode 110, a top electrode 112, a PCE 108, and a heater 106.

The heater dielectric layer 114 overlies the bottom electrodes 110 and, in some embodiments, the bottom electrodes 110 are recessed into a bottom of the heater dielectric layer 114. Alternatively, in other embodiments, the bottom electrodes 110 are recessed into an interconnect dielectric layer 202a underlying the heater dielectric layer 114. The heater dielectric layer 114 comprises a pair of heater openings 116 corresponding to the first and second PCM cells 102a, 102b. The heater openings 116 extend through the heater dielectric layer 114, from a top surface of the heater dielectric layer 114 respectively to the bottom electrodes 110, and respectively expose the bottom electrodes 110. In some embodiments, top corners 118 of the heater dielectric layer 114 that are in the heater openings 116 are rounded or curved.

The heaters 106 partially fill the heater opening 116, respectively, and contact the bottom electrodes 110, respectively. Further, the heaters 106 have top surfaces recessed below a top surface of the heater dielectric layer 114. The top surfaces of the heaters 106 may be, for example, substantially flat or planar. A top surface of the heater 106 for the first PCM cell 102a is recessed below the top surface of the heater dielectric layer 114 by a first distance $D_a$, and a top surface of the heater 106 for the second PCM cell 102b is recessed below the top surface of the heater dielectric layer 114 by a second distance $D_b$. The first distance $D_a$ may, for example, be different than the second distance $D_b$ due to process variation during a planarization (illustrated hereafter) used to form the heaters 106.

The PCEs 108 overlie the heater dielectric layer 114, between the heater dielectric layer 114 and the top electrodes 112. Further, the PCEs 108 partially fill the heater openings 116, respectively, and contact the top surfaces of the heaters 106, respectively. The PCEs 108 contact the top surfaces of the heaters 106 respectively at low deviation contact areas 104, and each comprise an active PCE region 108a extending upward into the PCE from a respective one of the low deviation contact areas 104.

Deviation between the low deviation contact areas 104 may be low since the low deviation contact areas 104 are defined by dimensions of the heater openings 116, which may be formed with low deviation. The low deviation between the low deviation contact areas 104 leads to low deviation between set currents of the first and second PCM cells 102a, 102b, as well as low deviation between reset currents of the first and second PCM cells 102a, 102b. Further, the low deviation between the set and reset currents leads to a large process window and a high yield during bulk manufacture of the PCM structure.

As illustrated by the top view 200B of FIG. 2B, the heaters 106 and the heater openings 116 may, for example, have square, rectangular, triangular, or circular layouts. Further, in some embodiments, the low deviation contact areas 104 of FIG. 2A have the same layouts respectively as the heaters 106 in FIG. 2B.

While FIGS. 2A and 2B were described as if the first and second PCM cells 102a, 102b have individual bottom electrodes 110, individual PCEs 108, and individual top electrodes 112, the first and second PCM cells 102a, 102b may share a bottom electrode, a top electrode, a PCE, or a combination of the foregoing in other embodiments. In some of such other embodiments, the first and second PCM cells 102a, 102b each have a respective region or segment of the shared component (e.g., the PCE or the top electrode).

Figure 3:
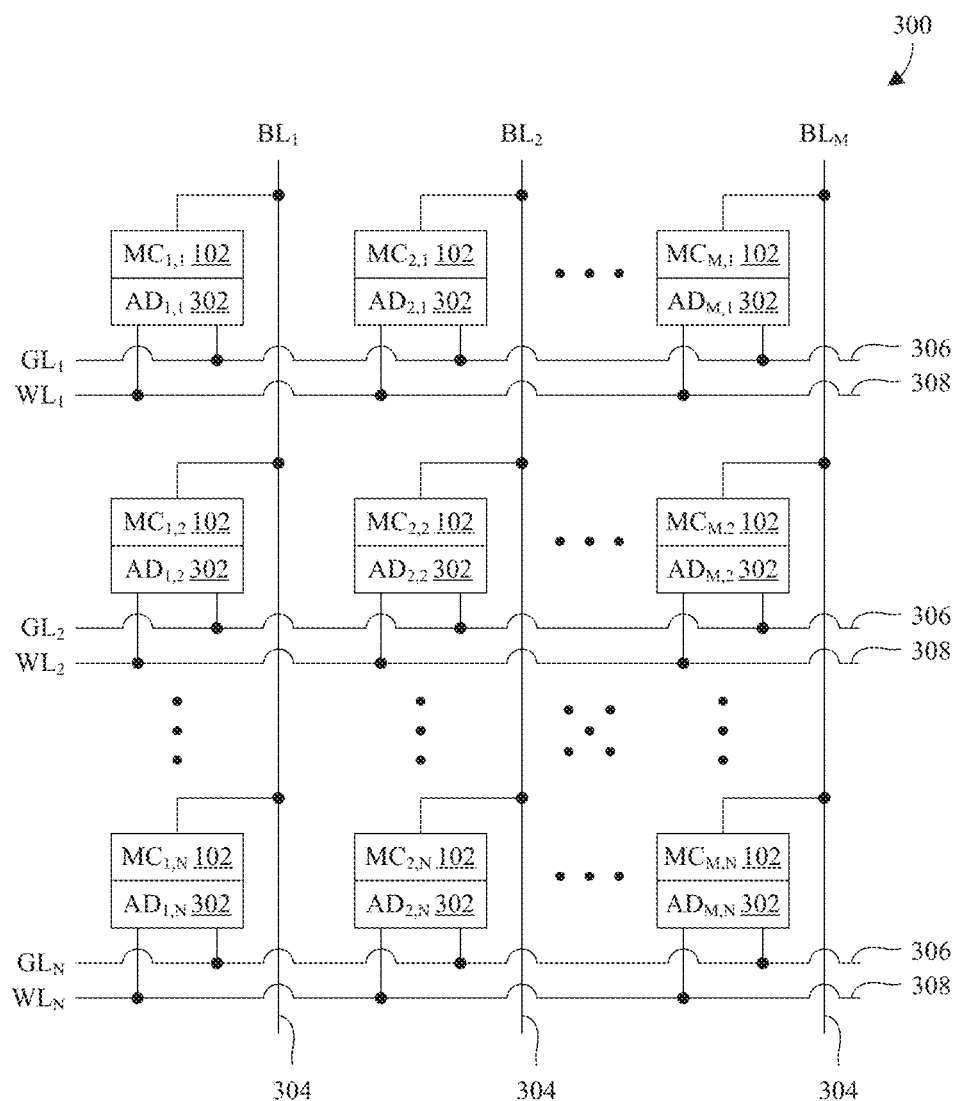
FIG. 3 illustrates a block diagram of some embodiments of a PCM structure comprising a PCM cell array with heater-to-PCE contact areas that have low deviation.

With reference to FIG. 3, a block diagram 300 of some embodiments of a PCM structure comprising a PCM cell array with heater-to-PCE contact areas that have low deviation is provided. As illustrated, the PCM cell array comprises a plurality of PCM cells 102 in M columns and N rows, where M and N are integers greater than zero. For clarity, the PCM cells 102 are individually labeled $MC_{<column>,<row>}$. The PCM cells 102 are located at the intersections of respective columns and respective rows, and are each as described in FIGS. 1A and 1B.

A plurality of access devices 302 correspond to the PCM cells 102, and selectively electrically couple the corresponding PCM cells 102 between a set of bit lines 304 and a set of ground lines 306 based on a set of word lines 308. For example, an access device may selectively electrically couple a corresponding bit line to a corresponding ground line through a corresponding PCM cell based on a corresponding word line. The correspondence between the PCM cells 102 and the access devices 302 may be, for example, one to one, and/or the access devices 302 may be, for example, insulated gate field-effect transistors (IGFETs). For clarity, the access devices 302 are individually labeled as $AD_{<column>,<row>}$.

The set of word lines 308 facilitate access to the PCM cells 102 on a row-by-row basis by gating the access devices 302, and includes a word line for each row. For clarity, the word lines 308 are individually labeled as $WL_{<row>}$. The set of bit lines 304 facilitate reading from and/or writing to accessed PCM memory cells on a column-by-column basis by selectively biasing the PCM cells 102, and includes a bit line for each column. For clarity, the bit lines 304 are individually labeled as $BL_{<column>}$. The set of ground lines 306 provide conductive paths to ground for the bit lines 304 on a row-by-row basis, and includes a ground line for each row. For clarity, the ground lines 306 are individually labeled as $GL_{<row>}$.

In operation of the PCM cell array, a row of PCM cells is accessed by activating a word line for the row. For example, word line $WL_1$ may be set to a logic "1" while the other word lines are set to a logic "0". This, in turn, electrically couples PCM cells of the row between a ground line for the row and respectively the bit lines 304 using corresponding access devices. For example, continuing with the above example, PCM cells $MC_{1,1}$, $MC_{2,1}$, and $MC_{M,1}$ may be electrically coupled between ground line $GND_1$ and respectively bit lines $BL_1$, $BL_2$, and $BL_M$ using access devices $AD_{1,1}$, $AD_{2,1}$, and $AD_{M,1}$. The PCM cells of the row may then be read from and/or written to by selectively biasing the bit lines 304.

Figure 4:
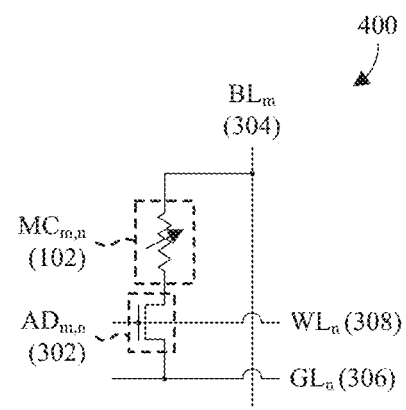
FIG. 4 illustrates a circuit diagram of some embodiments of the electrical coupling of a PCM cell between a bit line and a ground line in the PCM cell array of FIG. 3.

With reference to FIG. 4, a circuit diagram 400 of some embodiments of the electrical coupling of a PCM cell 102 between a bit line 304 and a ground line 306 in the PCM cell array of FIG. 3 is provided. The PCM cell 102 corresponds to PCM cell $MC_{m,n}$ at column m and row n in the PCM cell array of FIG. 3, where m and n are integers that are greater than zero and respectively less than or equal to M and N in FIG. 3. Further, the bit line 304 is bit line $BL_m$ at column m in the PCM cell array of FIG. 3, and the ground line 306 is ground line $GL_n$ at row n in the PCM cell array of FIG. 3.

As illustrated, a first terminal of the PCM cell 102 is electrically coupled to the bit line 304, and another terminal of the PCM cell 102 is electrically coupled to a first source/drain of an access device 302. The access device 302 corresponds to access device $AD_{m,n}$ at column m and row n in the PCM cell array of FIG. 3. Further, a second source/drain of the access device 302 is electrically coupled to the ground line 306, and a gate of the access device 302 is electrically coupled to a word line 308. The word line 308 is word line $WL_n$ at row n in the PCM cell array of FIG. 3.

While the PCM cells 102 are shown as being electrically coupled directly to the bit lines 304 in FIGS. 3 and 4, and the access devices 302 are shown as being electrically coupled directly to the ground lines 306 in FIGS. 3 and 4, such electrical coupling may be reversed in other embodiments. That is to say, in other embodiments, the PCM cells 102 may be electrically coupled directly to the ground lines 306 and the access devices 302 may be electrically coupled directly to the bit lines 304.

Figure 5A:
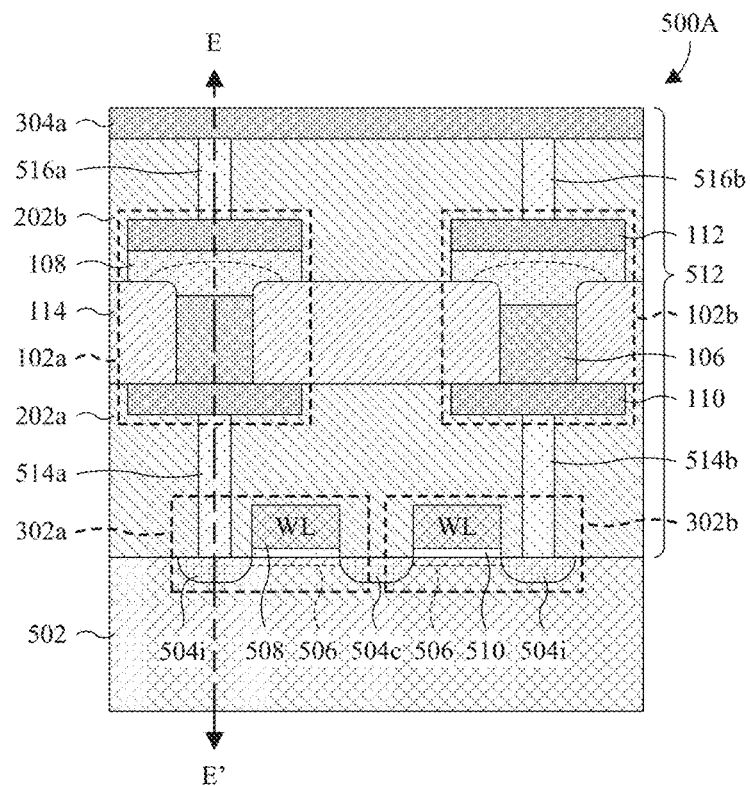
FIGS. 5A and 5B illustrate various cross-sectional views of some embodiments of an integrated circuit (IC) comprising a plurality of PCM cells with heater-to-PCE contact areas that have low deviation.
Figure 5B:
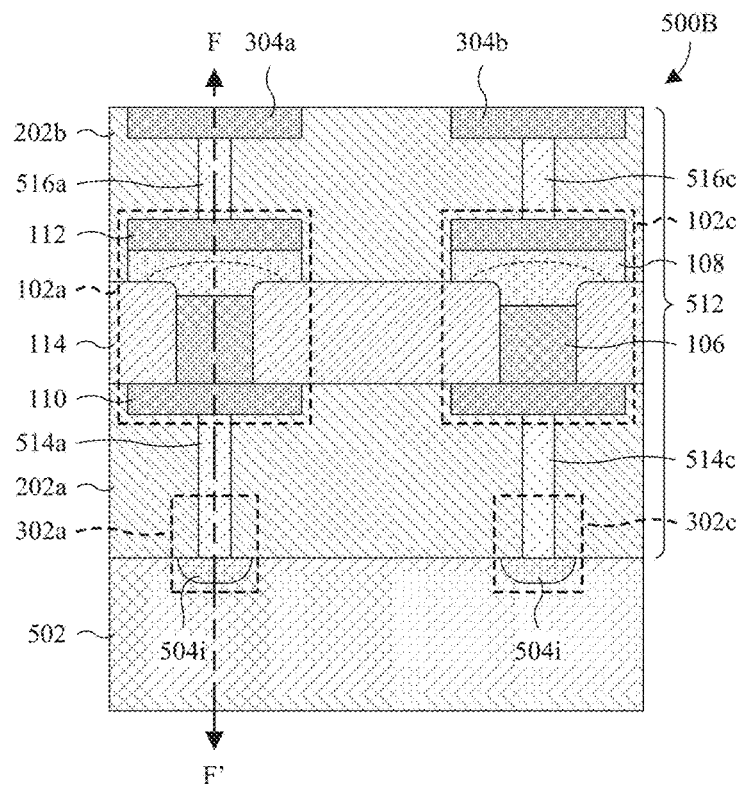

With reference to FIGS. 5A and 5B, various cross-sectional views 500A, 500B of some embodiments of an integrated circuit (IC) comprising a plurality of PCM cells with heater-to-PCE contact areas that have low deviation is provided. FIGS. 5A and 5B are orthogonal to one another. FIG. 5A illustrates a cross-sectional view 500A of the IC taken along line F-F' in FIG. 5B. FIG. 5B illustrates a cross-sectional view 500B of the IC taken along line E-E' in FIG. 5A.

As illustrated by the cross-sectional view 500A of FIG. 5A, a semiconductor substrate 502 supports a first access device 302a and a second access device 302b. The first and second access devices 302a, 302b may be, for example, IGFETs, and/or the semiconductor substrate 502 may be, for example, a bulk silicon substrate, a silicon-on-insulator (SOI) substrate, or some other type of semiconductor substrate.

The first and second access devices 302a, 302b share a common source/drain region 504c and have individual source/drain regions 504i. The individual source/drain regions 504i and the common source/drain region 504c are in the semiconductor substrate 502, along a top surface of the semiconductor substrate 502. Further, the individual source/drain regions 504i and the common source/drain region 504c define selectively-conductive channels 506 in the semiconductor substrate 502. The selectively-conductive channels 506 are individual to the first and second access devices 302a, 302b, and each extends from the common source/drain region 504c to a respective one of the individual source/drain regions 504i. In some embodiments, the common source/drain region 504c is a ground line (e.g., ground line $GL_1$ in FIG. 3).

The first and second access devices 302a, 302b each comprise a gate electrode 508 and a gate dielectric layer 510. For ease of illustration, only one of the gate electrodes 508 is labeled 508, and only one of the gate dielectric layers 510 is labeled 510. The gate electrode 508 and the gate dielectric layer 510 are stacked between the common source/drain region 504c and a respective one of the individual source/drain regions 504i. Further, the gate electrode 508 overlies the gate dielectric layer 510 and is conductive. The gate electrode 508 may be, for example, metal or doped polysilicon, and/or may be, for example, a word line (e.g., word line $WL_1$ in FIG. 3). The gate dielectric layer 510 may be, for example, oxide, a high κ dielectric, some other dielectric, or a combination of the foregoing. As used herein, a high κ dielectric is a dielectric with a dielectric constant κ greater than about 3.9, 5, 10, 15, or 20.

A back-end-of-line (BEOL) interconnect structure 512 covers the semiconductor substrate 502 and the first and second access devices 302a, 302b. The BEOL interconnect structure comprises a plurality of dielectric layers stacked upon one another. The dielectric layers comprise a first interconnect dielectric layer 202a, a heater dielectric layer 114 overlying the first interconnect dielectric layer 202a, and a second interconnect dielectric layer 202b overlying the heater dielectric layer 114. The heater dielectric layer 114 may be, for example, oxide, nitride, some other dielectric layer, or a combination of the foregoing, and/or the first and second interconnect dielectric layers 202a, 202b may be, for example, oxide, nitride, a low κ dielectric, some other dielectric, or a combination of the foregoing. As used herein, a low κ dielectric is a dielectric with a dielectric constant κ less than about 3.9, 3, 2, or 1.

The BEOL interconnect structure 512 further comprises a plurality of conductive features stacked within the plurality of dielectric layers (e.g., the first interconnect dielectric layer 202a). The conductive features comprise a first PCM cell via 514a, a second PCM cell via 514b, a first bit line 304a, a first bit line via 516a, and a second bit line via 516b. The first and second PCM cell vias 514a, 514b extend respectively from the individual source/drain regions 504i respectively to a first PCM cell 102a and a second PCM cell 102b. The first and second bit line vias 516a, 516b extend respectively from the first and second PCM cells 102a, 102b to the first bit line 304a.

The first and second PCM cells 102a, 102b underline the first bit line 304a, and respectively overlie the first and second access devices 302a, 302b. The first and second PCM cells 102a, 102b are as described in FIGS. 2A and 2B, and/or are each as the PCM cell 102 of FIGS. 1A and 1B is described. The first and second PCM cells 102a, 102b each comprise a bottom electrode 110, a top electrode 112, a PCE 108, and a heater 106. For ease of illustration, only one of the bottom electrodes 110 is labeled 110, only one of the top electrodes 112 is labeled 112, only one of the PCEs 108 is labeled 108, and only one of the heaters 106 is labeled 106.

As illustrated by the cross-sectional view 500B of FIG. 5B, a third access device 302c neighbors the first access device 302a. Although only partially shown, the third access device 302c is as the first and second access devices 302a, 302b are described with regard to FIG. 5A. Further, the first PCM cell via 514a and a third PCM cell via 514c extend respectively from individual source/drain regions 504i of the first and third access devices 302a, 302c respectively to the first PCM cell 102a and a third PCM cell 102c.

The first and third PCM cells 102a, 102c are each as the PCM cell 102 of FIGS. 1A and 1B is described, such that the first and third PCM cells 102a, 102c each comprise a bottom electrode 110, a top electrode 112, a PCE 108, and a heater 106. For ease of illustration, only one of the bottom electrodes 110 is labeled 110, only one of the top electrodes 112 is labeled 112, only one of the PCEs 108 is labeled 108, and only one of the heaters 106 is labeled 106. Further, the first and third PCM cells 102a, 102c respectively underlie the first bit line 304a and a second bit line 304b, and are electrically coupled to the first and second bit lines 304a, 304b respectively by the first bit line via 516a and a third bit line via 516c.

With reference to FIGS. 6-13, a series of cross-sectional views 600-1300 of some embodiments of a method for manufacturing a PCM structure comprising a pair of PCM cells with heater-to-PCE contact areas that have low deviation is provided. The PCM structure may, for example, be the PCM structure of FIGS. 2A and 2B, and/or may, for example, be part of the IC of FIGS. 5A and 5B.

Figure 6:
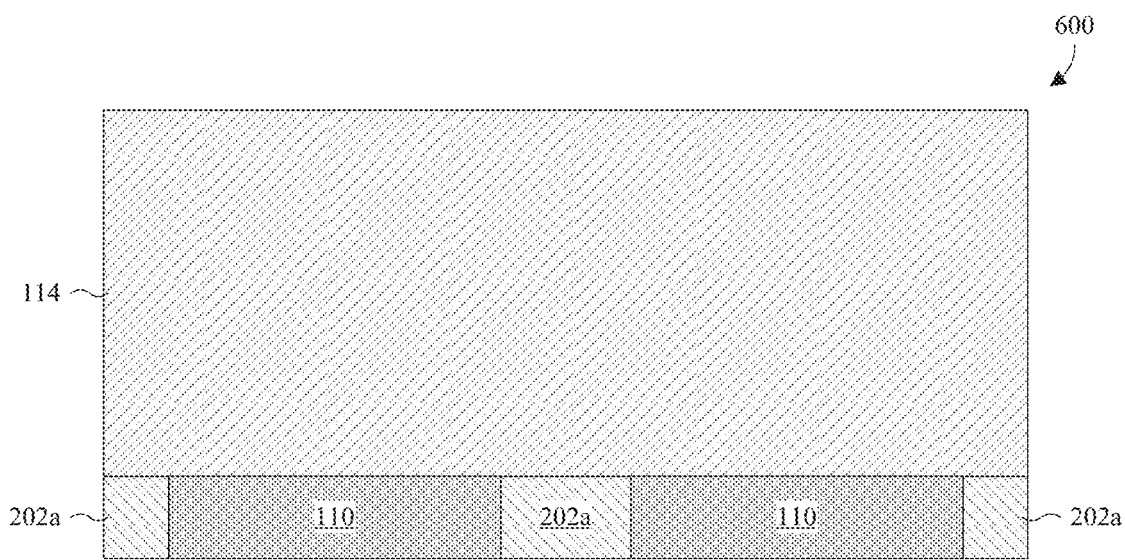
FIGS. 6-13 illustrate a series of cross-sectional views of some embodiments of a method for manufacturing a PCM structure comprising a pair of PCM cells with heater-to-PCE contact areas that have low deviation.

As illustrated by the cross-sectional view 600 of FIG. 6, a pair of bottom electrodes 110 is provided. In some embodiments, the bottom electrodes 110 are laterally spaced and sunken into an interconnect dielectric layer 202a, such that top surfaces respectively of the bottom electrodes 110 are even with a top surface of the interconnect dielectric layer 202a. The bottom electrodes 110 may be, for example, metal.

Also illustrated by the cross-sectional view 600 of FIG. 6, a heater dielectric layer 114 is formed on the bottom electrodes 110. In some embodiments, the heater dielectric layer 114 is formed with a top surface that is planar. Further, in some embodiments, the interconnect dielectric layer 202a is omitted, such that the heater dielectric layer 114 is formed in place of the interconnect dielectric layer 202a. The heater dielectric layer 114 may, for example, be formed of silicon dioxide, silicon nitride, some other dielectric, or a combination of the foregoing.

In some embodiments, a process for forming the heater dielectric layer 114 comprises depositing or growing the heater dielectric layer 114 on the bottom electrodes 110, and subsequently performing a planarization into the top surface of the heater dielectric layer 114. The heater dielectric layer 114 may, for example, be deposited or grown by, for example, thermal oxidation, vapor deposition, sputtering, or some other deposition process. Further, the planarization may, for example, be performed by a chemical mechanical polish (CMP).

Figure 7:
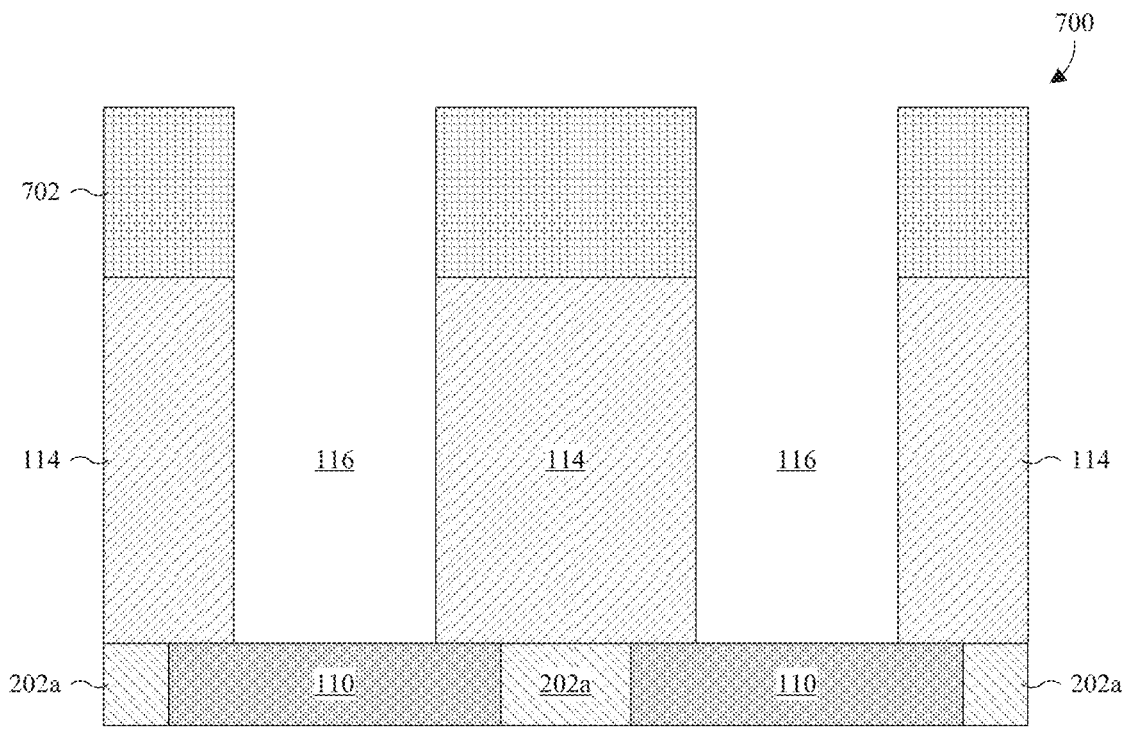

As illustrated by the cross-sectional view 700 of FIG. 7, a pair of heater openings 116 is formed in the heater dielectric layer 114. The heater openings 116 are formed respectively exposing the bottom electrodes 110. Further, the heater openings 116 may be formed with substantially the same dimensions, and/or such that dimensions of the heater openings 116 have low deviation between the heater openings 116. In some embodiments, a process for forming the heater openings 116 comprises performing an etch into the heater dielectric layer 114 while a patterned photoresist layer 702 selectively covers the heater dielectric layer 114, and subsequently stripping the patterned photoresist layer 702. The patterned photoresist layer 702 may, for example, be patterned using photolithography.

Figure 8:
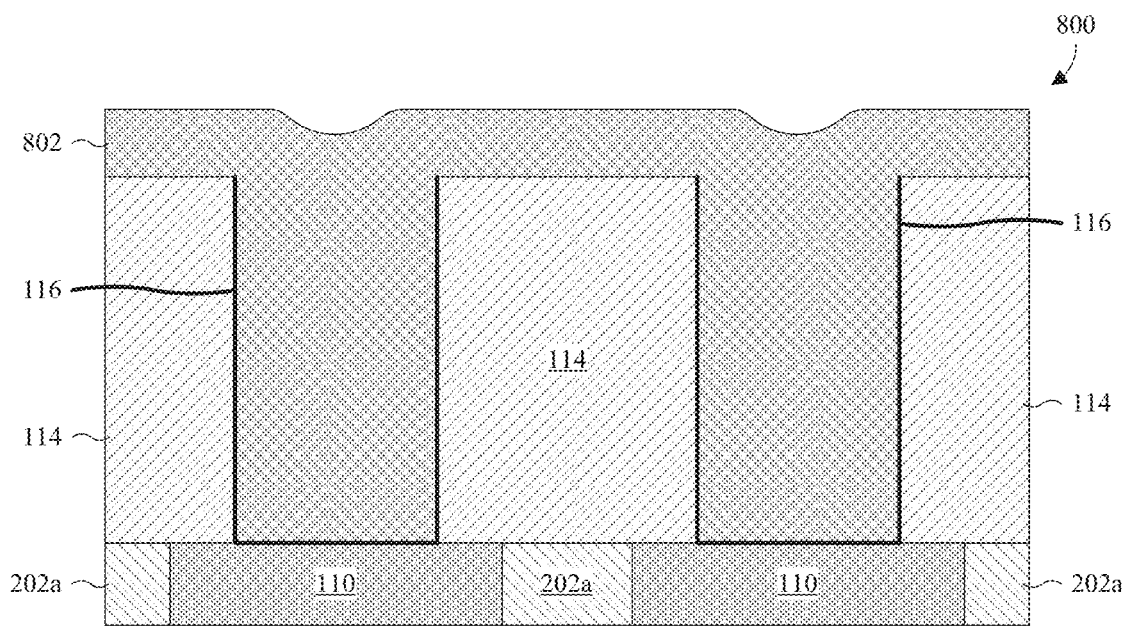

As illustrated by the cross-sectional view 800 of FIG. 8, a heater layer 802 is formed covering the heater dielectric layer 114, and further filling the heater openings 116. In some embodiments, the heater layer 802 is formed of titanium nitride, or some other material with a resistance within 10, 50, 100, 500, 1000, or 5000 ohms of titanium nitride. Further, in some embodiments, the heater layer 802 is formed by chemical vapor deposition, physical vapor deposition, or some other deposition or growth process.

Figure 9:
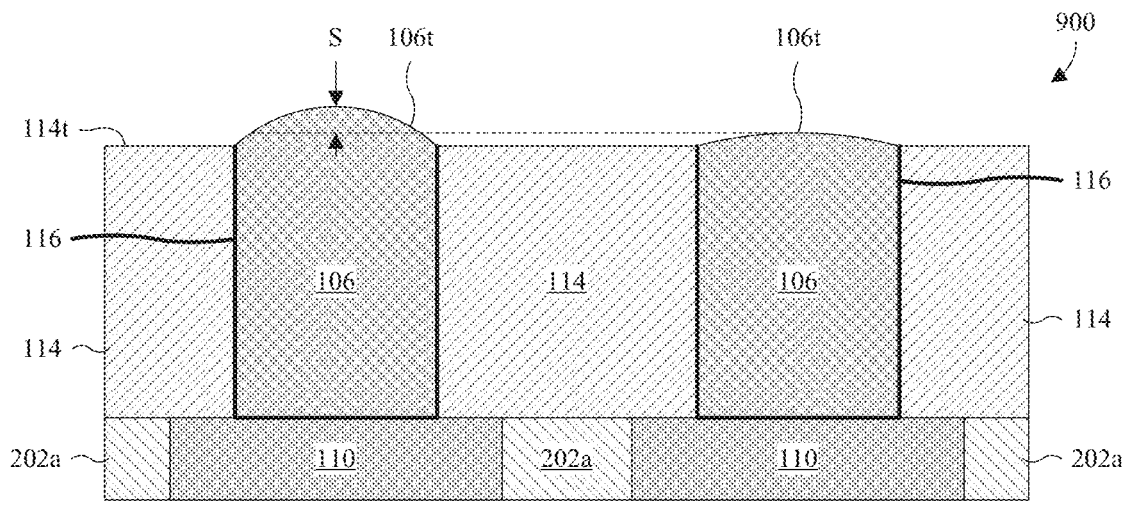

As illustrated by the cross-sectional view 900 of FIG. 9, a planarization is performed into the heater layer 802 (see FIG. 8) and the heater dielectric layer 114 to form a pair of heaters 106. The heaters 106 are formed respectively in the heater openings 116, and are formed with top surfaces 106t approximately even with a top surface 114t of the heater dielectric layer 114. In some embodiments, the top surfaces 106t of the heaters 106 have different profiles and/or different surface areas. The planarization may, for example, be performed by a CMP.

In some embodiments, the planarization removes material from the heater layer 802 at a different rate than from the heater dielectric layer 114 due to hardness differences. For example, where the heater layer 802 is harder than the heater dielectric layer 114, the planarization may remove material from the heater layer 802 at a slower rate than from the heater dielectric layer 114. As such, the top surfaces 106t of the heaters 106 have curved profiles in some embodiments. For example, the top surfaces 106t of the heaters 106 may be convex, such that the top surfaces 106t of the heaters 106 arc upward from edges of the top surfaces 106t to centers of the top surfaces 106t that that are spaced over the edges. As another example, the top surfaces 106t of the heaters 106 may be concave, such that the top surfaces 106t of the heaters 106 arc downward from edges of the top surfaces 106t to centers of the top surfaces 106t that that are spaced below the edges. Further, in some embodiments, the top surfaces 106t of the heaters 106 deviate (e.g., in profile and/or height above the bottom electrodes 110) due to process variations associated with the planarization. For example, centers of the top surfaces 106t of the heaters 106 may be vertically spaced by a spacing amount S. The process variations may, for example, be due to variations in localized loading of a CMP head.

High deviation between the top surfaces 106t of the heaters 106, in turn, leads to high deviation in surface areas of the top surfaces 106t. As such, if PCEs were respectively formed over and contacting the top surfaces 106t of the heaters 106, the contact areas between the heaters 106 and the respective PCEs would have high deviation. For example, one of the heaters 106 would have a first contact area with its respective PCE, and another one of the heaters 106 would have a second, substantially different contact area with its respective PCE. The high deviation between the contact areas results in high deviation between set currents for PCM cells under manufacture, as well as high deviation between reset currents for the PCM cells. Further, the high deviation between the contact areas results in a small process window and low yield during bulk manufacture of the PCM cells.

Figure 10:
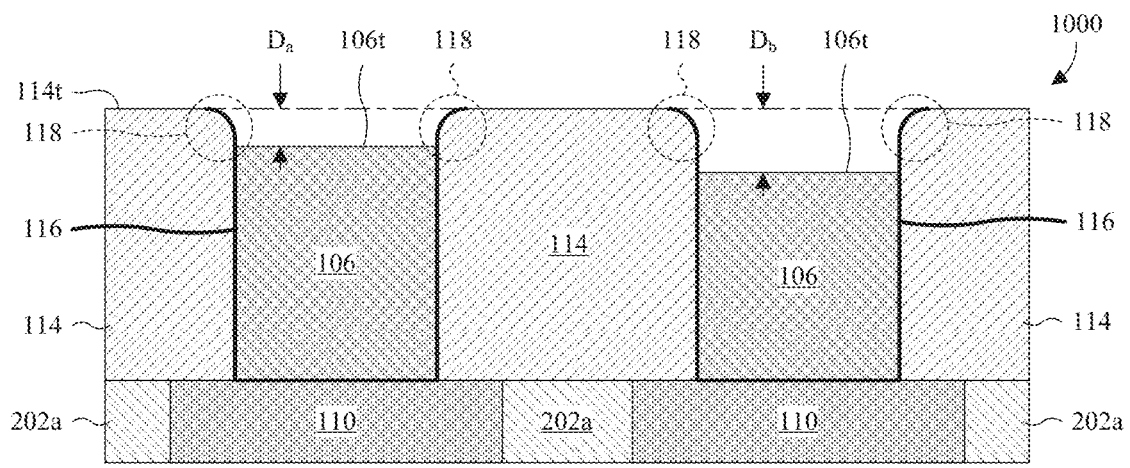

As illustrated by the cross-sectional view 1000 of FIG. 10, an etch back is performed into the heaters 106 to mitigate the above noted deviation. The etch back flattens the top surfaces 106t of the heaters 106, and further recesses the top surfaces 106t to below the top surface 114t of the heater dielectric layer 114. In some embodiments, the top surfaces 106t of the heaters 106 are recessed to below the top surface 114t of the heater dielectric layer 114 by varying amounts due to deviations between the top surfaces 106t. For example, one of the heaters 106 may have a top surface 106t recessed below the top surface 114t of the heater dielectric layer 114 by a first distance $D_a$, and another one of the heaters 106 may have a top surface 106t recessed below the top surface 114t of the heater dielectric layer 114 by a second distance $D_b$ that is different than the first distance $D_a$. Further, in some embodiments, the etch back rounds or curves top corners 118 of the heater dielectric layer 114 that are in the heater openings 116. The etch back may, for example, be performed by a wet or dry etch. In some embodiments, the etch is performed by a dry plasma etch and the flow rates of the process gases forming the plasma are controlled to flatten the top surfaces 106t of the heaters 106.

The etch back reduces deviation between the top surfaces 106t of the heaters 106 since the top surfaces 106t are flattened and dimensions of the top surfaces 106t are defined by the heater openings 116. As noted above, the heater openings 116 may be formed with substantially the same size and/or such that there is low deviation between dimensions of the heater openings 116.

Figure 11:
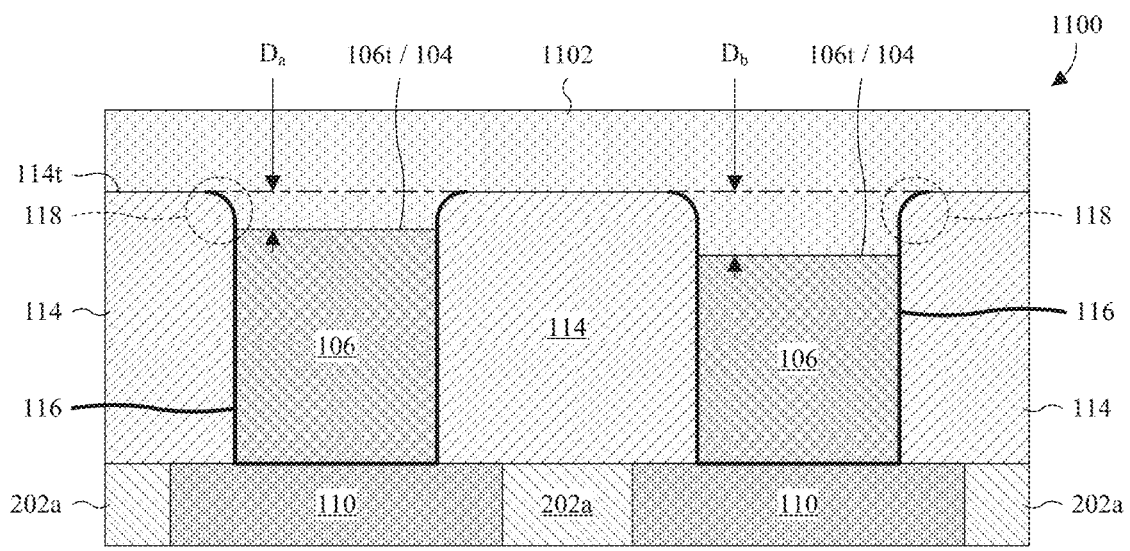

As illustrated by the cross-sectional view 1100 of FIG. 11, a phase change layer 1102 is formed overlying the heater dielectric layer 114 and filling a remainder of the heater openings 116. Further, the phase change layer 1102 is formed contacting the top surfaces 106t of the heaters 106 at low deviation contact areas 104. The low deviation contact areas 104 have low deviation because, as noted above, the top surfaces 106t of the heaters 106 have low deviation. The PCE 108 may, for example, be formed by chemical or physical vapor deposition, sputtering, or some other deposition or growth process. Further, the PCE 108 may, for example, be formed of GST, GIST, AIST, or some other chalcogenide compound.

Figure 12:
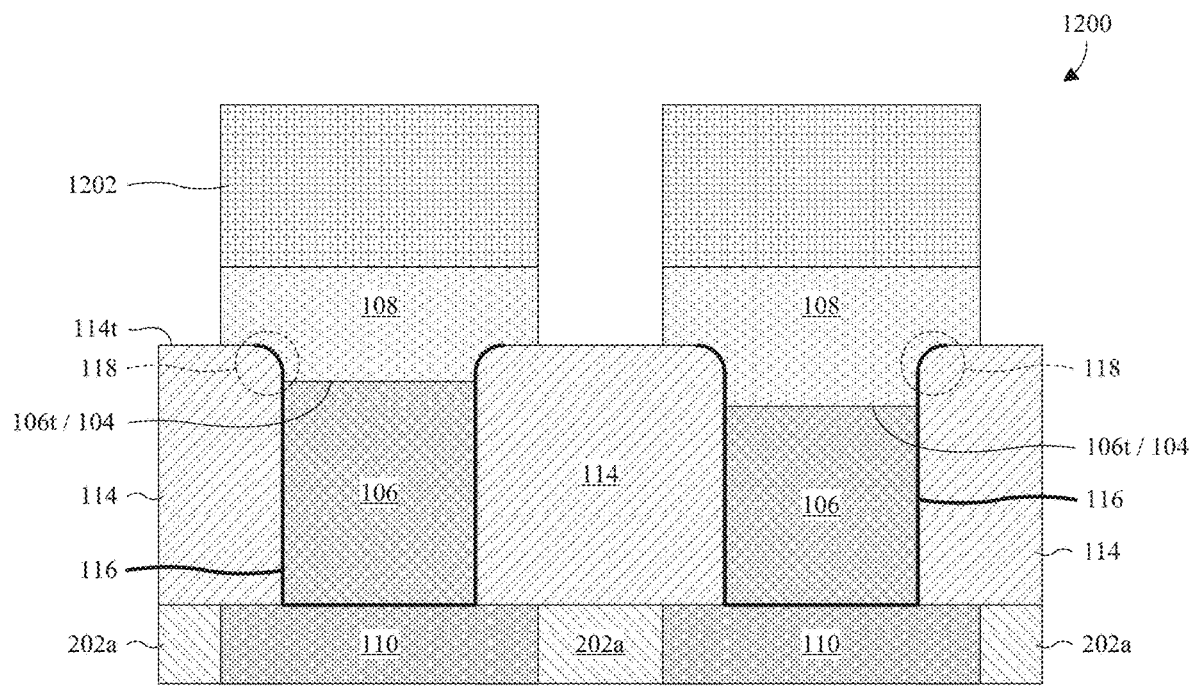

As illustrated by the cross-sectional view 1200 of FIG. 12, the phase change layer 1102 (see FIG. 11) is patterned to form a pair of PCEs 108 respectively overlying and contacting the heaters 106. In some embodiments, a process for forming the PCEs 108 comprises performing an etch into the phase change layer 1102 while a patterned photoresist layer 1202 selectively covers the phase change layer 1102, and subsequently stripping the patterned photoresist layer 1202. The patterned photoresist layer 1202 may, for example, be patterned using photolithography.

Figure 13:
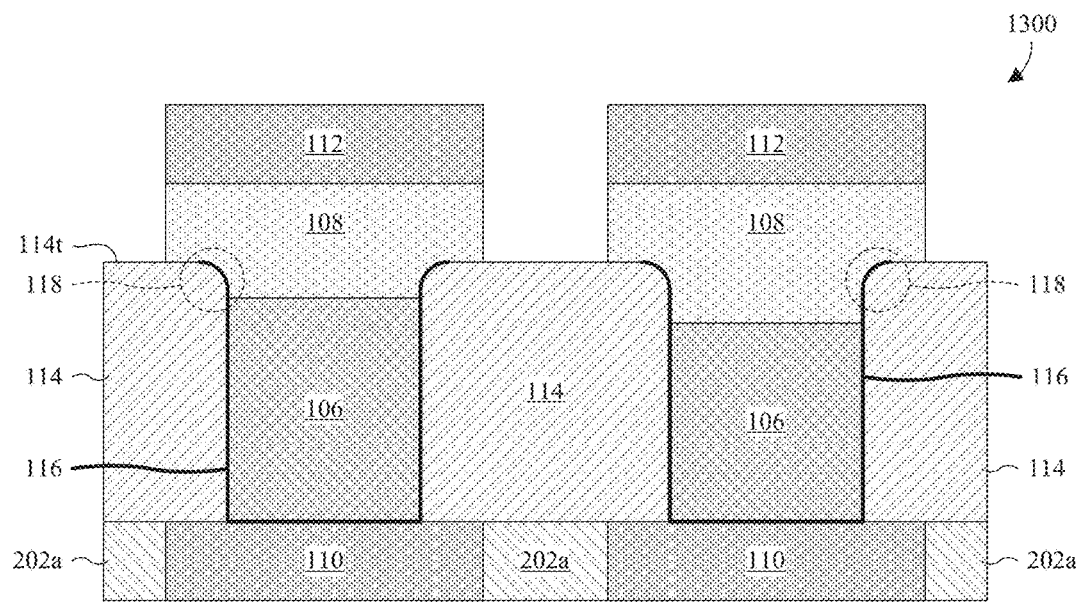

As illustrated by the cross-sectional view 1300 of FIG. 13, a pair of top electrodes 112 is formed on the PCEs 108. The top electrodes 112 are formed respectively overlying the PCEs 108 and may, for example, be formed of tungsten, copper, aluminum copper, or some other conductive material. In some embodiments, a process for forming the top electrodes 112 comprises depositing or growing a top electrode layer over the PCEs 108, and subsequently patterning the top electrode layer into the top electrodes 112. The depositing or growing of the top electrode layer may, for example, be performed using vapor deposition, electrochemical plating, or some other deposition or growth process. Further, the patterning of the top electrode layer may, for example, be performed using photolithography.

Figure 14:
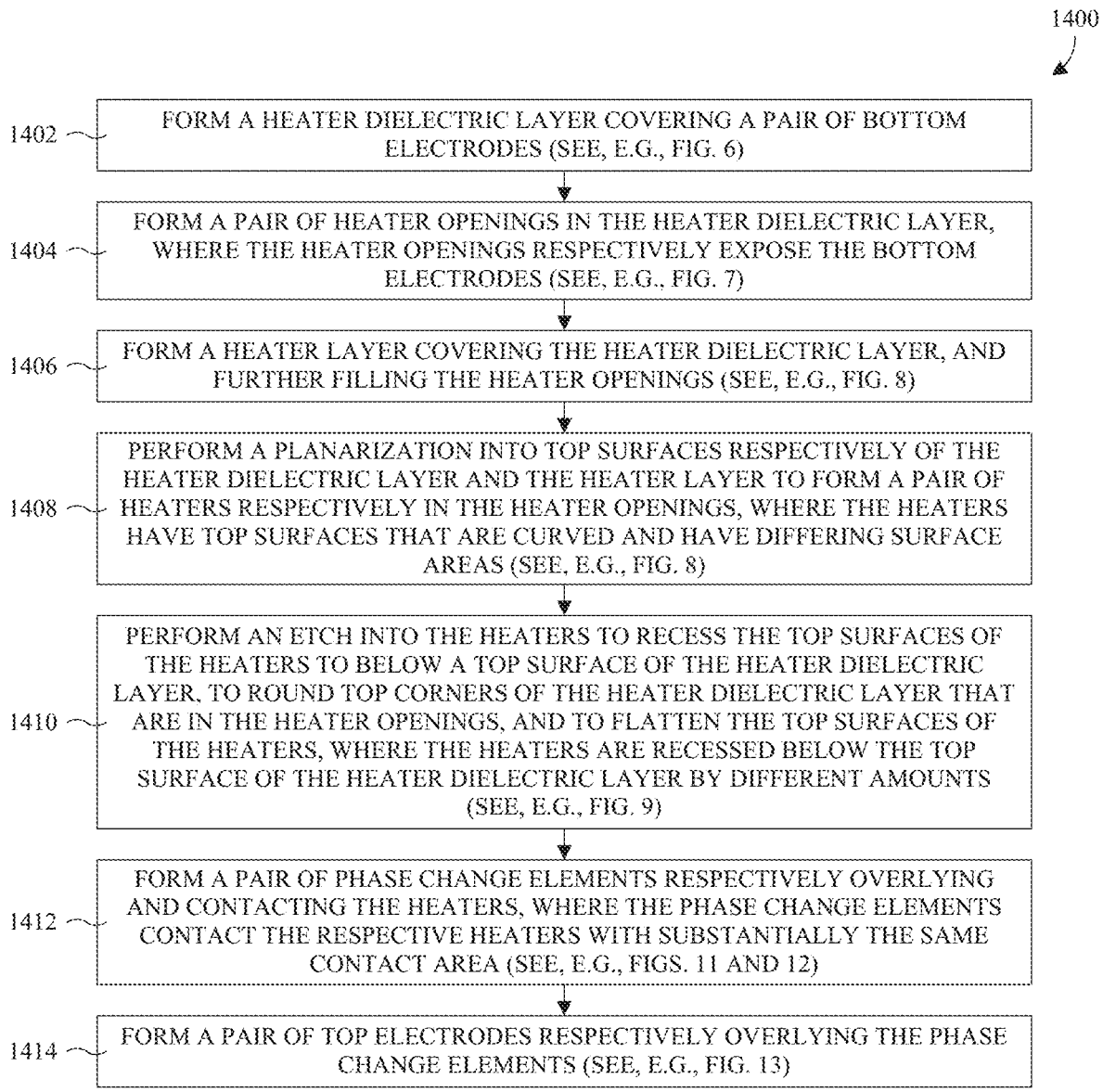
FIG. 14 illustrates a flowchart of some embodiments of the method of FIGS. 6-13.

With reference to FIG. 14, a flowchart 1400 of some embodiments of the method of FIGS. 6-14 is provided.

At 1402, a heater dielectric layer is formed covering a pair of bottom electrodes. See, for example, FIG. 6.

At 1404, a pair of heater openings is formed in the heater dielectric layer. The heater openings are formed respectively exposing the bottom electrodes. See, for example, FIG. 7.

At 1406, a heater layer is formed covering the heater dielectric layer, and further filling the heater openings. See, for example, FIG. 8.

At 1408, a planarization is performed into top surfaces respectively of the heater dielectric layer and the heater layer to form a pair of heaters respectively in the heater openings, The heaters are formed with top surfaces that are curved and have differing surface areas. See, for example, FIG. 9.

At 1410, an etch is performed into the heaters to recess the top surfaces of the heaters to below a top surface of the heater dielectric layer, to round top corners of the heater dielectric layer that are in the heater openings, and to flatten the top surfaces of the heaters. The heaters are recessed below the top surface of the heater dielectric layer by different amounts. See, for example, FIG. 10. The etch reduces deviation between the top surfaces of the heaters. By flattening the top surfaces of the heaters, and by recessing the top surfaces of the heaters to below the top surface of the heater dielectric layer, the top surfaces of the heaters are defined by dimensions of the heater openings. Further, the heater openings can be manufactured so the dimensions have low deviation between the heater openings. As such, the top surfaces of the heaters have high uniformity.

At 1412, a pair of PCEs is formed. The PCEs are formed respectively overlying and contacting the heaters, and the PCEs contact the respective heaters with substantially the same contact area. See, for example, FIGS. 11 and 12. Because the top surfaces of the heaters have high uniformity, the heaters have low deviation contact areas with the respective PCEs. This, in turn, leads to low deviation set and reset currents for PCM cells under manufacture by the method, as well as a large process window for manufacturing the PCM cells.

At 1414, a pair of top electrodes is formed. The top electrodes are formed respectively overlying the PCEs. See, for example, FIG. 13.

While the flowchart 1400 of FIG. 14 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, in some embodiments, the present application provides a PCM structure. The PCM structure includes: a bottom electrode; a dielectric layer overlying the bottom electrode; a heater extending upward from the bottom electrode, through the dielectric layer, wherein the heater has a top surface that is substantially planar and that is spaced below a top surface of the dielectric layer; and a phase change element overlying the dielectric layer and protruding into the dielectric layer to contact with the top surface of the heater.

In other embodiments, the present application provides a method for manufacturing a PCM structure. A heater dielectric layer is formed overlying a bottom electrode. A heater opening is formed in the heater dielectric layer. The heater opening exposes the bottom electrode. A heater is formed in the heater opening. The heater has a top surface that is curved. The top surface of the heater is at least partially spaced over a top surface of the heater dielectric layer. An etch back is performed into the heater to flatten the top surface of the heater, and to completely recess the top surface of the heater to below the top surface of the heater dielectric layer. A phase change element is formed overlying and contacting the top surface of the heater.

In yet other embodiments, the present disclosure provides another PCM structure. The other PCM structure includes: a dielectric layer; a first heater extending upward through the dielectric layer, from about even with a bottom surface of the dielectric layer, and terminating at a top surface of the first heater; a second heater extending upward through the dielectric layer, from about even with the bottom surface of the dielectric layer, and terminating at a top surface of the second heater; and a phase change element overlying the dielectric layer and protruding downward into the dielectric layer to contact with the top surface of the first heater; wherein the top surfaces of the first and second heaters are spaced below the top surface of the dielectric layer and are substantially planar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
   a bottom electrode;
   a dielectric layer overlying the bottom electrode;
   a data storage structure overlying a top surface of the dielectric layer and having a protrusion protruding downward into the dielectric layer from the top surface; and
   a heater in the dielectric layer and extending from the protrusion to the bottom electrode;

wherein a region of the data storage structure is configured to change between phases in response to heat from the heater, and the heater and the protrusion define a first common sidewall that directly contacts the dielectric layer continuously from the top surface of the dielectric layer to the bottom electrode.

2. The IC according to claim 1, further comprising:
a substrate underlying the bottom electrode; and
a contact via extending from the substrate to the bottom electrode, wherein the contact via is independent of the bottom electrode.

3. The IC according to claim 1, wherein the heater and the protrusion define a second common sidewall that directly contacts the dielectric layer, and is smooth, continuously from the top surface of the dielectric layer to the bottom electrode, and wherein the first and second common sidewalls are respectively on opposite sides of the heater.

4. The IC according to claim 1, wherein the data storage structure wraps around a top corner of the dielectric layer at the protrusion and the top surface of the dielectric layer, and wherein the top corner is rounded.

5. The IC according to claim 1, wherein the data storage structure comprises a chalcogenide compound, and wherein the heater comprises titanium nitride.

6. The IC according to claim 1, wherein a width of the bottom electrode exceeds a width of the heater.

7. The IC according to claim 1, wherein the dielectric layer has a pair of sidewalls that adjoin the heater and the protrusion when viewed in cross section, and wherein a lateral separation between the sidewalls varies continuously from the bottom electrode to the top surface of the dielectric layer.

8. An integrated circuit (IC) comprising:
a first bottom electrode;
a dielectric layer overlying the first bottom electrode;
a first phase change structure overlying a top surface of the dielectric layer, wherein a width of the first phase change structure decreases continuously from a first width value at the top surface of the dielectric layer to a second width value below the top surface; and
a first heater in the dielectric layer and extending from the first phase change structure to the first bottom electrode, wherein a width of the first heater is substantially equal to the second width value at the first phase change structure.

9. The IC according to claim 8, wherein the width of the first heater is continuous from the first phase change structure to the first bottom electrode.

10. The IC according to claim 8, wherein the first heater and the first phase change structure directly contact at an interface, and wherein the width of the first phase change structure is substantially equal to the second width value at the interface.

11. The IC according to claim 8, wherein the first heater and the first phase change structure directly contact at an interface that is substantially planar.

12. The IC according to claim 8, wherein the first phase change structure consists essentially of a single material, and wherein the first heater consists essentially of a single material.

13. The IC according to claim 8, further comprising:
a transistor underlying the first bottom electrode; and
an interconnect structure comprising a plurality of vias and a plurality wires, wherein the wires and the vias are alternatingly stacked and define a conductive path from the first bottom electrode to the transistor.

14. The IC according to claim 8, further comprising:
a second bottom electrode;
a second phase change structure overlying the top surface of the dielectric layer; and
a second heater in the dielectric layer and extending from the second phase change structure to the second bottom electrode;
wherein the first phase change structure and the first heater directly contact at a first interface, and wherein the second phase change structure and the second heater directly contact at a second interface that is vertically offset from the first interface.

15. A method for manufacturing a phase change memory (PCM) structure, the method comprising:
depositing a dielectric layer covering a first electrode;
patterning the dielectric layer to form a first opening in the dielectric layer and exposing the first electrode;
forming a first heater in the first opening;
after the forming of the first heater, recessing a top surface of the first heater relative to a top surface of the dielectric layer; and
forming a phase change element overlying the top surface of the dielectric layer and protruding into the dielectric layer to the top surface of the first heater.

16. The method according to claim 15, wherein the forming of the first heater comprises:
depositing a conductive layer covering the dielectric layer and further filling the first opening; and
performing a chemical mechanical polish (CMP) into the conductive layer until a top surface of the conductive layer is about even with the top surface of the dielectric layer.

17. The method according to claim 15, further comprising:
forming a second heater in the dielectric layer simultaneously with the forming of the first heater, wherein the second heater is level with the first heater and has a top surface vertically offset from the top surface of the first heater.

18. The method according to claim 15, wherein the recessing increases a flatness of the top surface of the first heater.

19. The method according to claim 15, wherein the recessing comprises:
applying an etchant to the top surface of the first heater.

20. The method according to claim 15, wherein a corner of the dielectric layer in the first opening is square between the forming of the first heater and the recessing, and wherein the corner is curved after the recessing.

* * * * *